United States Patent [19]
Mizutani

[11] Patent Number: 5,973,377
[45] Date of Patent: Oct. 26, 1999

[54] SEMICONDUCTOR DEVICE HAVING FETS WITH SHARED SOURCE AND DRAIN REGIONS

[75] Inventor: Hiroshi Mizutani, Tokyo, Japan

[73] Assignee: NEC Corporation, Tokyo, Japan

[21] Appl. No.: 08/777,348

[22] Filed: Dec. 27, 1996

[30] Foreign Application Priority Data

Dec. 28, 1995 [JP] Japan .................................. 7-342566

[51] Int. Cl.$^6$ .................................................. H01L 29/76
[52] U.S. Cl. ............................................ 257/401; 257/48
[58] Field of Search ...................................... 257/401, 48

[56] References Cited

U.S. PATENT DOCUMENTS

| | | | |
|---|---|---|---|
| 4,974,059 | 11/1990 | Kinzer | 257/401 |
| 5,367,187 | 11/1994 | Yuen | 257/401 |
| 5,479,034 | 12/1995 | Hashimoto | 257/401 |
| 5,616,940 | 4/1997 | Kato | 257/401 |
| 5,703,381 | 12/1997 | Iwasa | 257/401 |

FOREIGN PATENT DOCUMENTS

| | | |
|---|---|---|
| 47-464 | 1/1972 | Japan . |
| 53-60155 | 5/1978 | Japan . |
| 63-67802 | 3/1988 | Japan . |
| 63-238716 | 10/1988 | Japan . |
| 2-18960 | 1/1990 | Japan . |
| 3-120102 | 12/1991 | Japan . |
| 4-214665 | 8/1992 | Japan . |
| 7-326952 | 12/1995 | Japan . |

OTHER PUBLICATIONS

Schindler, M.J., "DC–40 GHz and 20–40 GHz MMIC SPDT Switches", *IEEE Transactions on Microwave Theory and Techniques*, vol. MTT–35, No. 12, Dec. 1987, pp. 1486–1493.

*Primary Examiner*—David Nelms
*Assistant Examiner*—Hoai V. Ho
*Attorney, Agent, or Firm*—Young & Thompson

[57] ABSTRACT

The conventional semiconductor device having a switching function is attended with a problem that in addition to a drawback of a large area occupied by the folded structure of gate electrodes, there are not obtained sufficient effect in association with the minimization in the device size and improvement of the performance. A transmission line is connected to a shared electrode between a drain electrode of a first FET and a source electrode of a second FET. There are disposed a first shared electrode including a drain electrode of the second FET and a source electrode of a third FET and a second shared electrode including drain electrodes of the third and fourth FETs. The second shared electrode is connected to a transmission line. Gate electrodes of the first and fourth FETs and gate electrodes of the second, and third FETs are fabricated to have an identical orientation of the plane of substrate. Consequently, the area occupied by the switching circuit is reduced when compared with the configuration including gate electrodes in the folded contour.

4 Claims, 13 Drawing Sheets

SEMICONDUCTOR DEVICE HAVING FETS WITH SHARED SOURCE AND DRAIN REGIONS

BACKGROUND OF THE INVENTION

The present invention relates to a semiconductor device, and in particular, to a semiconductor device operating as a switching circuit having at least one field-effect transistor (FET).

Description of the Related Art

There is a conventional semiconductor device that functions as a semiconductor switching circuit employing four FETs including source and drains thereof configured to oppose each other at positions of symmetry in a comb shape and gates disposed therebetween (reference is to be made to the Japanese Patent Laid-Open Publication No. 63-67802 entitled "Switching Circuit").

Figure 1A:
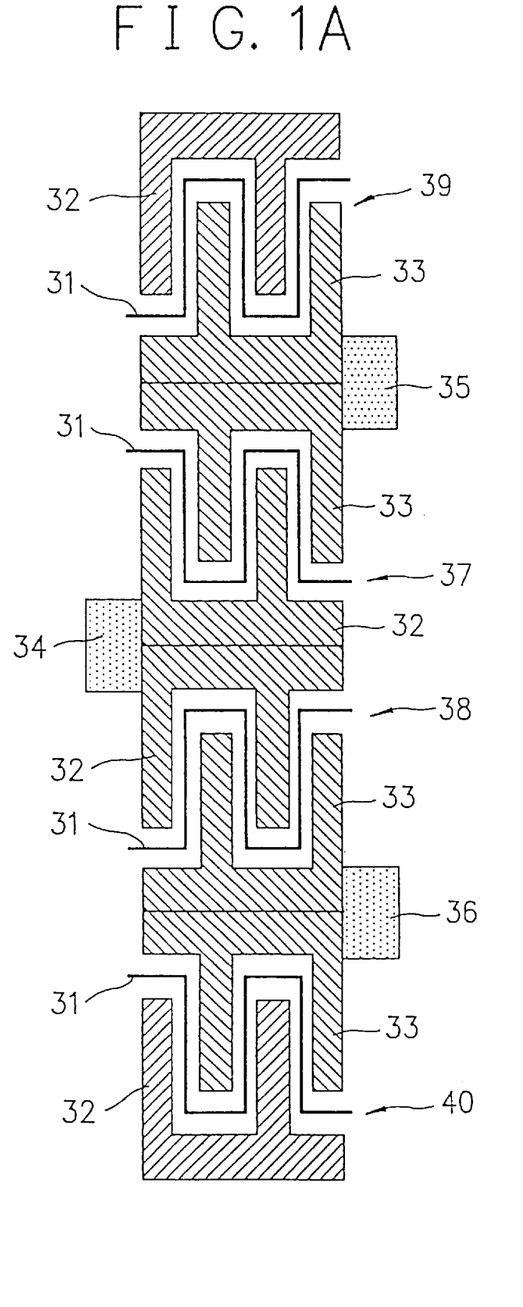
FIG. 1A is a diagram showing a plan view in accordance with the prior art.
Figure 1B:
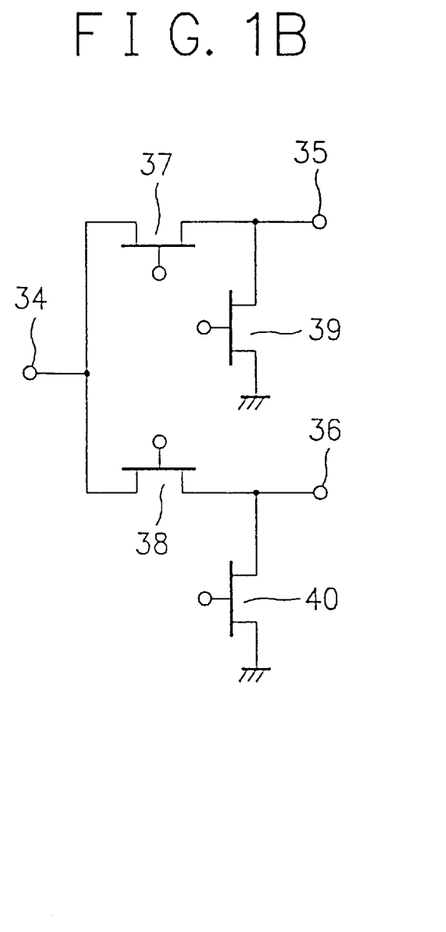
FIG. 1B is an equivalent circuit of an example of the semiconductor device in accordance with the prior art.

In FIG. 1A thereof is a plan view showing an example of the semiconductor device of the prior art and FIG. 1B is a circuit diagram of the circuit construction of FIG. 1A. In the device of the conventional technology, there are included four FETs 37 to 40. As can be seen from FIG. 1A, each FET includes a source region 32 and a drain region 33 arranged respectively at opposing positions of symmetry in a comb contour and a gate region 31 manufactured between the source region 32 and the drain region 33. In the FETs 37 and 38, the source regions 32 thereof are connected to each other to be commonly linked with an input terminal 34. The drain regions 33 of the FETs 39 and 40 are respectively coupled with the drains 33 of the FETs 37 and 38 to be commonly connected to output terminals 35 and 36, respectively.

Consequently, the semiconductor device has an equivalent circuit as shown in FIG. 1B in which the source 32 of the FETs 37 and 38 is connected to the input terminal 34, the drain 33 of the FETs 37 and 38 is connected the drain 33 and the output terminals 35 and 36. In this structure, the source 32 of the FETs 39 and 40 is grounded.

In the semiconductor device, the gates 31 of the FETs 37 and 40 receive a first switching signal and the gates 31 of the FETs 38 and 39 receive a second switching signal, the first switching signal being obtained by logically inverting the second switching signal. Therefore, a microwave signal supplied to the input terminal 34 is selected as an output signal from either one of the output terminals 35 and 36. In short, according to the logical values respectively of the first and second switching signals, the input signal can be obtained from either one of the output terminals 35 and 36.

In this regard, for each of the FETs of the switch, the drain-source resistance Rds in the on state of the FET should be decreased; whereas, when the FET is off, the drain-source capacitance Cds should be lowered. Ordinarily, the drain-source resistance Rds increases in inverse proportion to the gate width of the FET and the drain-source capacitance Cds soars in proportion to the gate width.

Consequently, an optimal combination of Rds and Cds can be obtained by optimizing the gate width. For this purpose, in the conventional semiconductor device shown in FIG. 12, to prevent the increase in the capacitance Cds due to intersections between the gate and source electrodes and/or between the gate and drain electrodes, the source 32 and drain 33 are arranged to oppose to each other at positions of symmetry in the comb shape. To increase the gate width, the gate 31 is fabricated in a folded contour between the source 32 and drain 33 in the plan view.

However, it has been known in a case in which a chemical semiconductor substrate highly sensitive to the ion bond that the characteristic of the FET, for example, the drain-source resistance Rds is increased depending on the direction of the gate. In the resulting conventional semiconductor device including the gate region 31 folded to decrease the drain-source resistance Rds as shown in FIG. 1A, there may occur a disadvantage of increase in the resistance Rds depending on cases. In short, the folded structure of the gate region 31 is not suitable for the FET used in the switching circuit.

Additionally, the capacitance resulting from intersections between the gate and source electrodes and/or between the gate and drain electrodes becomes almost negligible when the air bridge technology is employed. In consequence, the semiconductor device of the prior technology is attended with a problem regarding the minimization in size and improvement of the performance in addition to a relatively large area occupied by the folded shape of the gate region 31.

Incidentally, the switching circuits include many types of circuits such as a circuit of single pole single throw (SPST) type and a circuit of single pole double throw (SPDT) type. As can be seen from FIG. 1B, the conventional semiconductor device includes an SPDT circuit. However, applications thereof to other circuit types and other configurations employing a plurality of FETs have not been described in the article.

SUMMARY OF THE INVENTION

It is therefore an object of the present invention to provide a semiconductor device in which the size of the semiconductor can be minimized while the high performance thereof is kept unchanged, thereby solving the problems above.

To achieve the object above in accordance with a first aspect of the present invention, there is provided a semiconductor device including a plurality of field-effect transistors (FETs) connected in series between a first transmission line and a second transmission line. In two adjacent FETs including a first FET and a second FET of the plural FETs, all or a portion of source or drain electrodes of the first FET are shared with all or a portion of drain or source electrodes of the second FET and gate electrodes respectively of the first and second FETs are connected to each other and have an identical orientation of the plane of substrate.

Furthermore, to achieve the object above in accordance with a third aspect of the present invention, there is provided a semiconductor device including a plurality of FETs connected in series between a transmission line and a grounded conductor wherein in two adjacent FETs including a first FET and a second FET of the plural FETs, all or a portion of source or drain electrodes of the first FET are shared with all or a portion of drain or source electrodes of the second FET and gate electrodes respectively of the first and second FETs are connected to each other and have an identical orientation of the plane of substrate.

Additionally, to achieve the object above in accordance with a fifth aspect of the present invention, there is provided a semiconductor device wherein in two FETs including a first FET and a second FET connected commonly via the first and second transmission line to each other, all or a portion of source or drain electrodes of the first FET are shared with all or a portion of drain or source electrodes of the second FET and gate electrodes respectively of the first and second FETs are connected to each other and have an identical orientation of the plane of substrate.

Moreover, to achieve the object above in accordance with a sixth aspect of the present invention, there is provided a semiconductor device wherein in two adjacent FETs including a first FET and a second FET of the plural series-connected FETs, all or a portion of source or drain electrodes of the first FET are shared with all or a portion of drain or source electrodes of the second FET, gate electrodes of all of the FETs have an identical orientation of the plane of substrate, and the gate electrodes of the FETs connected in series between the first and third transmission lines are insulated from the gate electrodes of the FETs connected in series between the second and third transmission lines.

In addition, to achieve the object above in accordance with the second, fourth, and seventh aspects of the present invention, there is provided a semiconductor device wherein in two adjacent FETs including a first FET and a second FET of the plural FETs, gate electrodes respectively of the first and second FETs are connected to each other and have an identical orientation of the plane of substrate and no electrode exists between the gate electrodes.

As above, in accordance with the present invention, there is provided a semiconductor device wherein in two adjacent FETs including a first FET and a second FET of the plural series-connected FETs, all or a portion of source or drain electrodes of the first FET are shared with all or a portion of drain or source electrodes of the second FET. Moreover, gate electrodes of all of the FETs have an identical orientation of the plane of substrate. Consequently, when compared with the conventional semiconductor device in which the source and drain electrodes of two adjacent FETs connected to each other are fabricated in the respective processes and the gate electrodes are manufactured in the folded shape, the area occupied by the electrodes can be remarkably reduced in accordance with the present invention.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENTS

Referring next to the accompanying drawings, description will be given of embodiments of the semiconductor device in accordance with the present invention.

Figure 2:
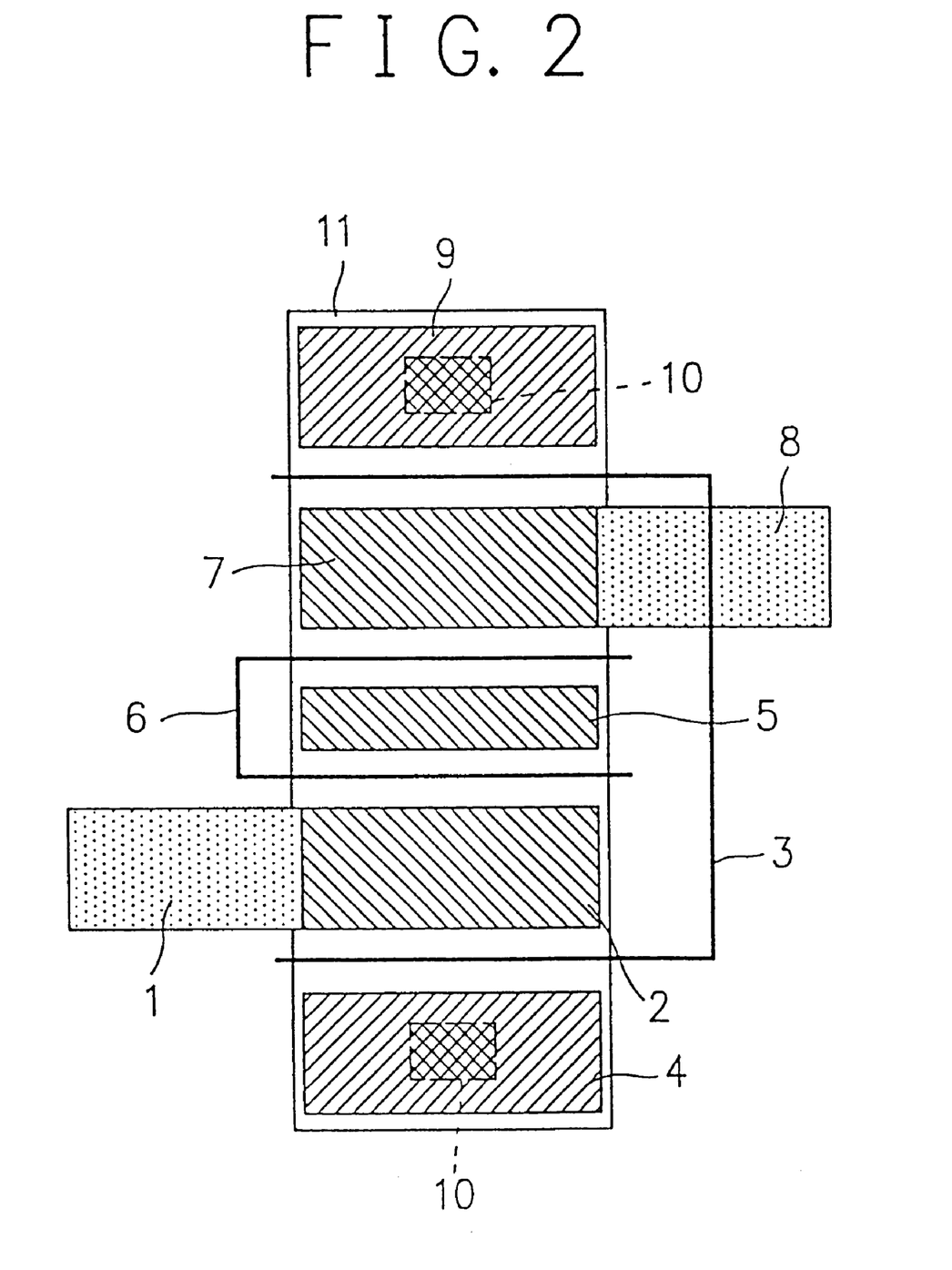
FIG. 2 is a plan view showing the configuration of a first embodiment of the semiconductor device in accordance with the present invention.

FIG. 2 shows in a plan view a first embodiment of the semiconductor device in accordance with the present invention. As shown in this diagram, the configuration includes a first transmission line 1 connected to a shared electrode 2 serving as a drain electrode of a first FET and a source electrode of a second FET. There are also provided a shared electrode 5 functioning as a drain electrode of the second FET and a source electrode of a third FET and a shared electrode 7 for a drain electrode of the third FET and a drain electrode of a fourth FET. The shared electrode 7 is connected to a second transmission line 8.

Moreover, the first and fourth FETs respectively include source electrodes 4 and 9 connected through a via hole 10 to grounding electrodes, respectively. Between the shared electrode 2 including the drain electrode of the first FET and the source electrode of the second FET and the source electrode 4 of the first FET between the shared electrode 7 including the drain electrodes of the third and fourth FETs and the source electrode 9 of the fourth FET, there are manufactured electrodes connected to each other to be applied with a first potential, the electrodes having an identical orientation of the plane of substrate. The electrodes constitute gate electrodes 3 of the first and fourth FETs.

Additionally, between the shared electrode 5 including the drain electrode of the second FET and the source electrode of the third FET and the shared electrode 2 and between the shared electrodes 5 and 7, there are fabricated electrodes connected to each other to be applied with a second potential. These electrodes have an identical orientation of the plane of substrate and serve as gate electrodes 6 of the second and third FETs. The device further includes an active region 11. Since the gate electrodes 3 and 6 are manufactured to possess the same orientation of the plane of substrate, the area of the switching circuit can be minimized when compared with the conventional device including the folded shape of gate electrodes.

Figure 3:
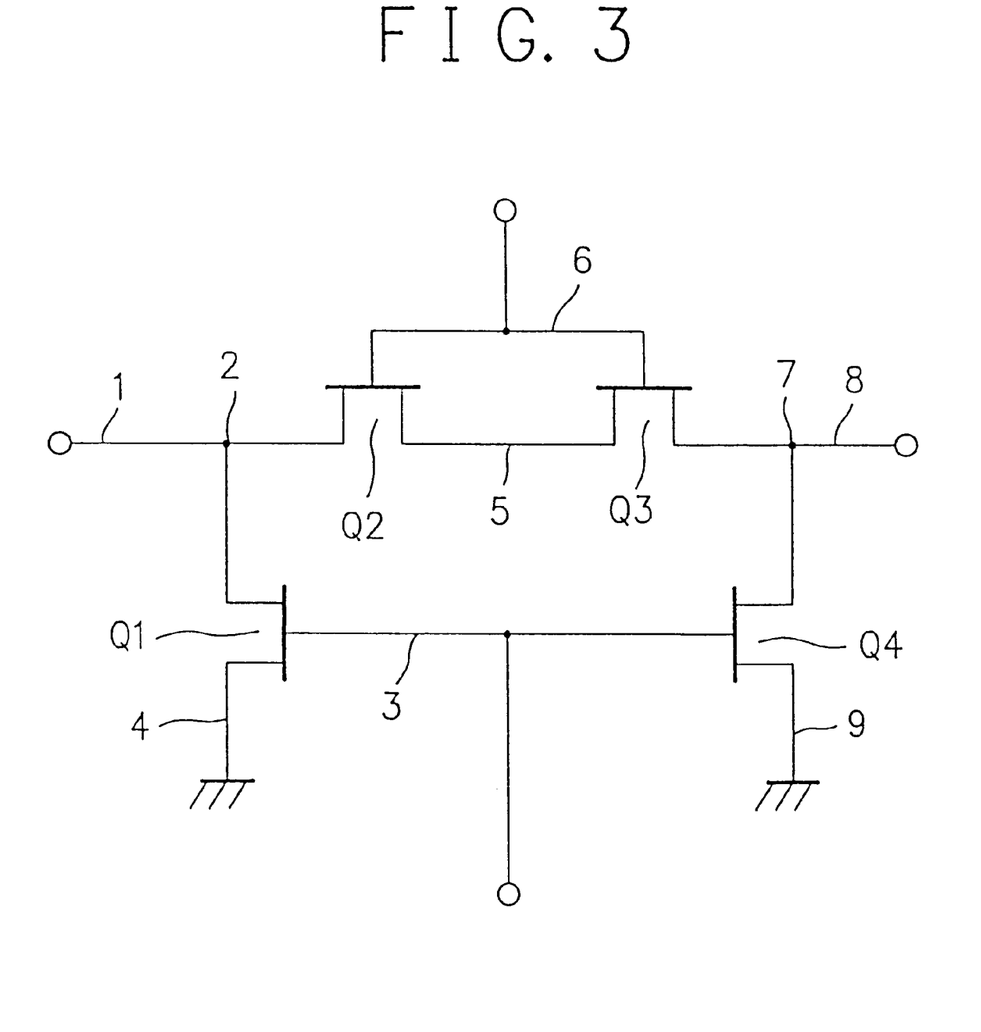
FIG. 3 is a diagram showing an equivalent circuit of the configuration of the first embodiment of the semiconductor device in accordance with the present invention.

FIG. 3 shows in an equivalent circuit diagram the constitution of the first embodiment. As can be seen from the diagram, the shared electrode 2 including the drain electrode of the first FET Q1 and the source electrode of the second FET Q2 is linked with the transmission line 1. The drain electrode of the second FET Q2 is connected via the shared electrode 5 to the source electrode of the third FET Q3, and the shared electrode 7 including the drain electrodes of the third and fourth FETs Q3 and Q4 is coupled with a transmission line 8. Additionally, the drain electrode of the first FET Q1 is connected via the shared electrode 3 to the gate electrode of the fourth FET Q4, and the gate electrode of the second FET Q2 is linked via the shared electrode 6 with the gate electrode of the third FET Q3.

In the semiconductor device in accordance with the first embodiment, a first switching signal applied to the gates respectively of the FETs Q1 and Q4 is obtained by logically inverting a second switching signal applied to the gates of the FETs Q2 and Q3. Therefore, when the FETs Q1 and Q4 are on, the FETs Q2 and Q3 are turned off and hence an input signal, for example, a signal of a microwave band supplied from the transmission line 1 cannot be transmitted to the transmission line 8. On the other hand, when the FETs Q1 and Q4 are off, the FETs Q2 and Q3 are set to on states and hence the input signal from the transmission line 1 is selectively transmitted via the FETs Q2 and Q3 to the transmission line 8.

Figure 4:
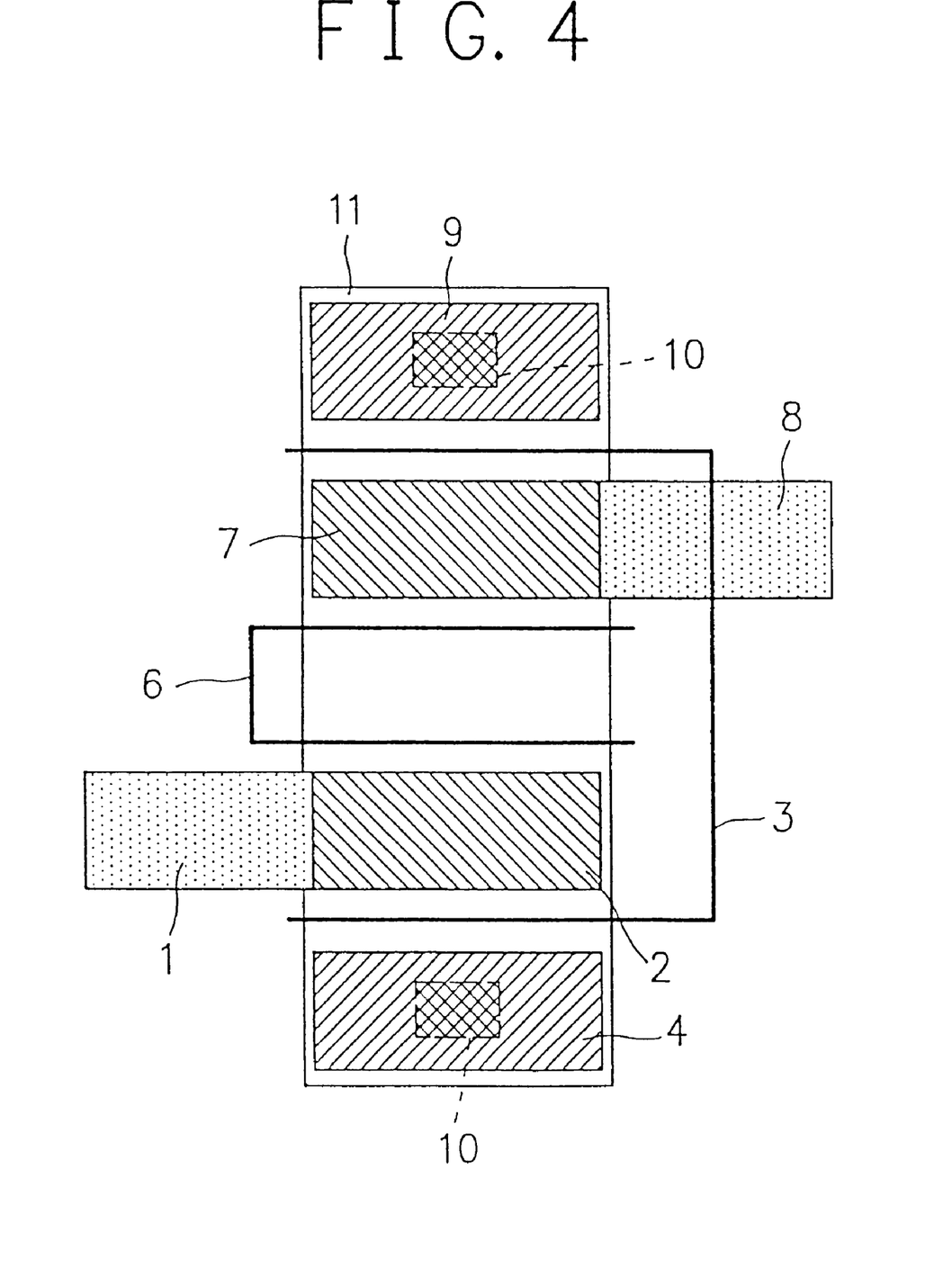
FIG. 4 is a plan view showing the configuration of a second embodiment of the semiconductor device in accordance with the present invention.

FIG. 4 is a plan view showing the construction of a second embodiment of the semiconductor device in accordance with the present invention. In this diagram, the same constituent elements as those of FIG. 2 are respectively assigned with the same reference numerals. Although the second embodiment of FIG. 4 is almost the same in constitution as the first embodiment, the second embodiment differs from the first embodiment in that the shared electrode 5 including the drain electrode of the second FET and the source electrode of the third FET of the first embodiment is missing. This means that the size of the second embodiment can be much smaller in comparison with the first embodiment.

The equivalent circuit of the second embodiment shown in FIG. 4 is substantially the same as that of the first embodiment shown in FIG. 3 for the following reason. Although there is missing the shared electrode 5 including the drain electrode of the second FET and the source electrode of the third FET and no electrode is fabricated on surfaces respectively of the drain of the second FET and the source of the third FET, an electric connection is established therebetween by the active region 11.

Figure 5:
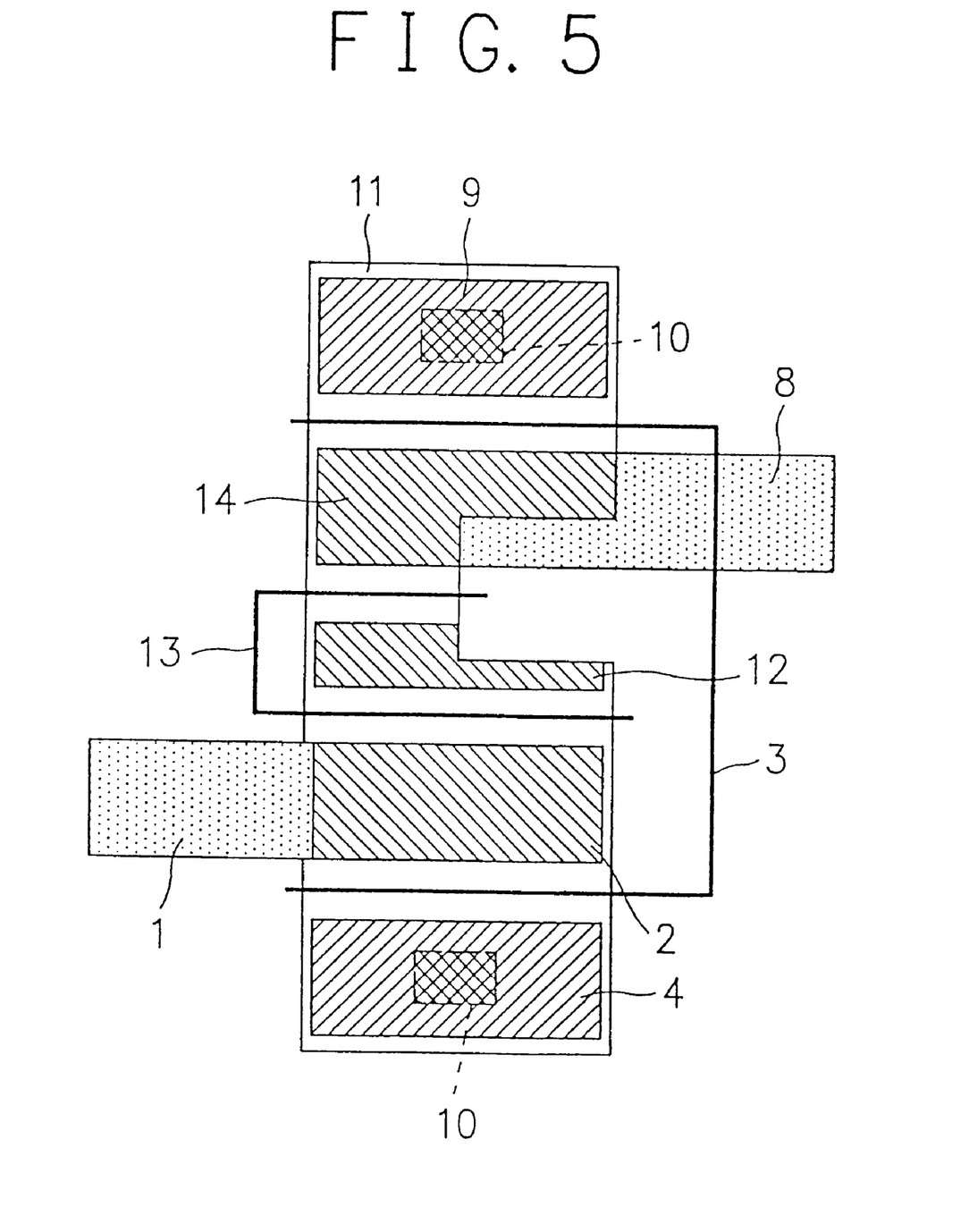
FIG. 5 is a plan view showing the configuration of a third embodiment of the semiconductor device in accordance with the present invention.

FIG. 5 shows in a plan view the structure of a third embodiment of the semiconductor device in accordance with the present invention. In the diagram, the same constituent components as those of FIG. 2 are respectively assigned with the same reference numerals. While the gate width is fixed in the first embodiment of FIG. 2, the gate width of the third FET is reduced in the third embodiment of FIG. 5.

That is, as can be seen from FIG. 5, in a shared electrode 12 including the drain electrode of the second FET and the source electrode of the third FET and a shared electrode 14 including the drain electrodes respectively of the third and fourth FETs, each of the widths thereof on a first side on which these electrodes 12 and 14 oppose to each other is smaller than that on a second side opposing the first side. Moreover, formed between the shared electrodes 12 and 14 is a gate electrode 13 having a reduced length. It is to be appreciated that the third embodiment is flexible in the realization of improvement of the performance and minimization of the device when compared with the first embodiment.

Figure 6:
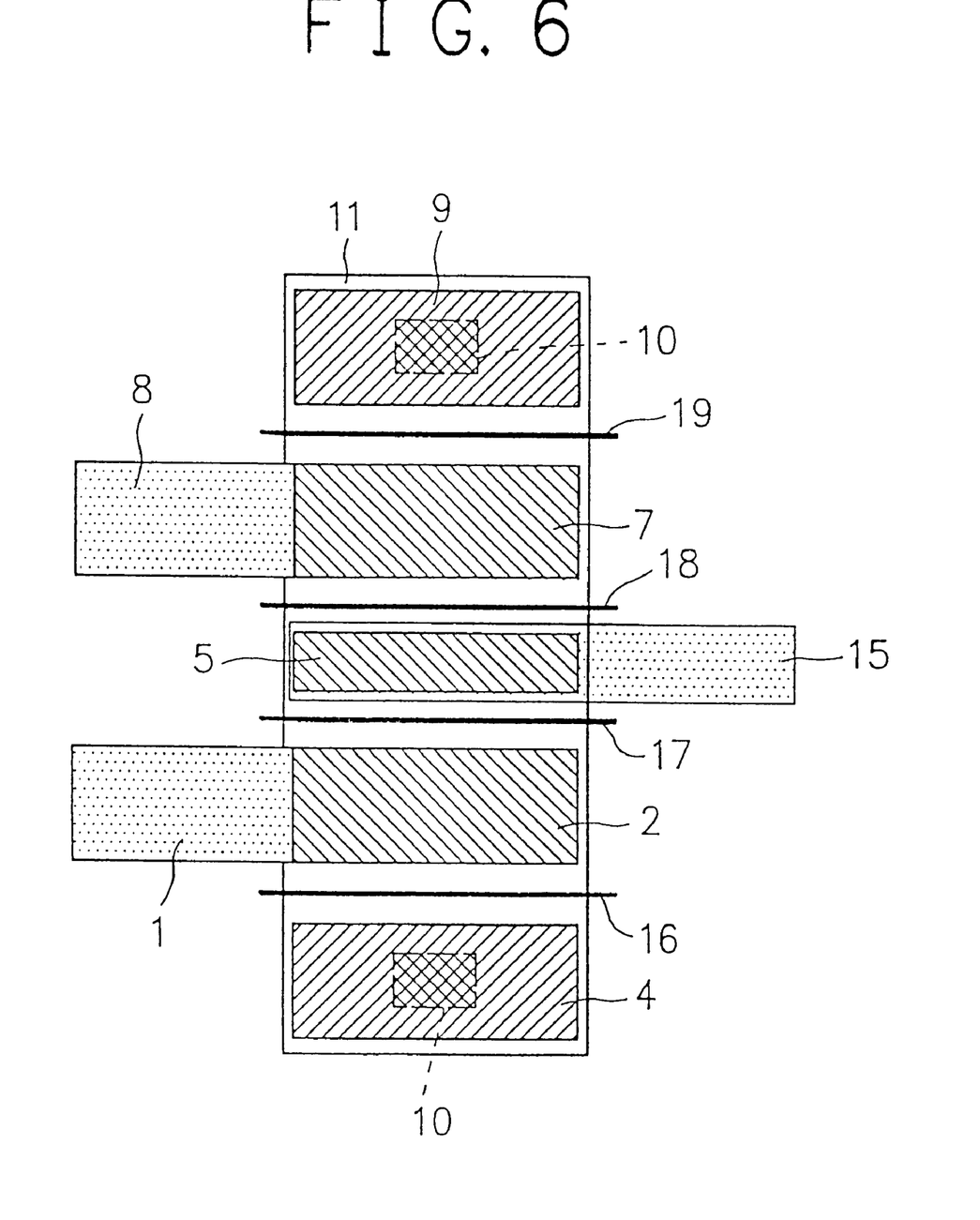
FIG. 6 is a plan view showing the configuration of a fourth embodiment of the semiconductor device in accordance with the present invention.

FIG. 6 is a plan view showing the construction of a fourth embodiment of the semiconductor device in accordance with the present invention. In FIG. 6, the same constituent elements as those of FIG. 2 are respectively assigned with the same reference numerals. In this configuration, a shared electrode including the drain electrode of the second FET and the source electrode of the third FET is coupled with a third transmission line. Additionally, a gate electrode 16 of the first FET is formed between the source electrode 4 and the shared electrode 2, a gate electrode 17 of the second FET is manufactured between the shared electrodes 2 and 5, a gate electrode 18 is fabricated between the shared electrodes 5 and 7, and a gate electrode 19 of the fourth FET is provided between the shared electrode 7 and the source electrode 9. Namely, the gate electrodes 16 to 19 are configured to possess the same orientation of the plane of substrate. The source electrodes 4 and 9 respectively of the first and fourth FETs are coupled with grounding electrodes, respectively.

Figure 7:
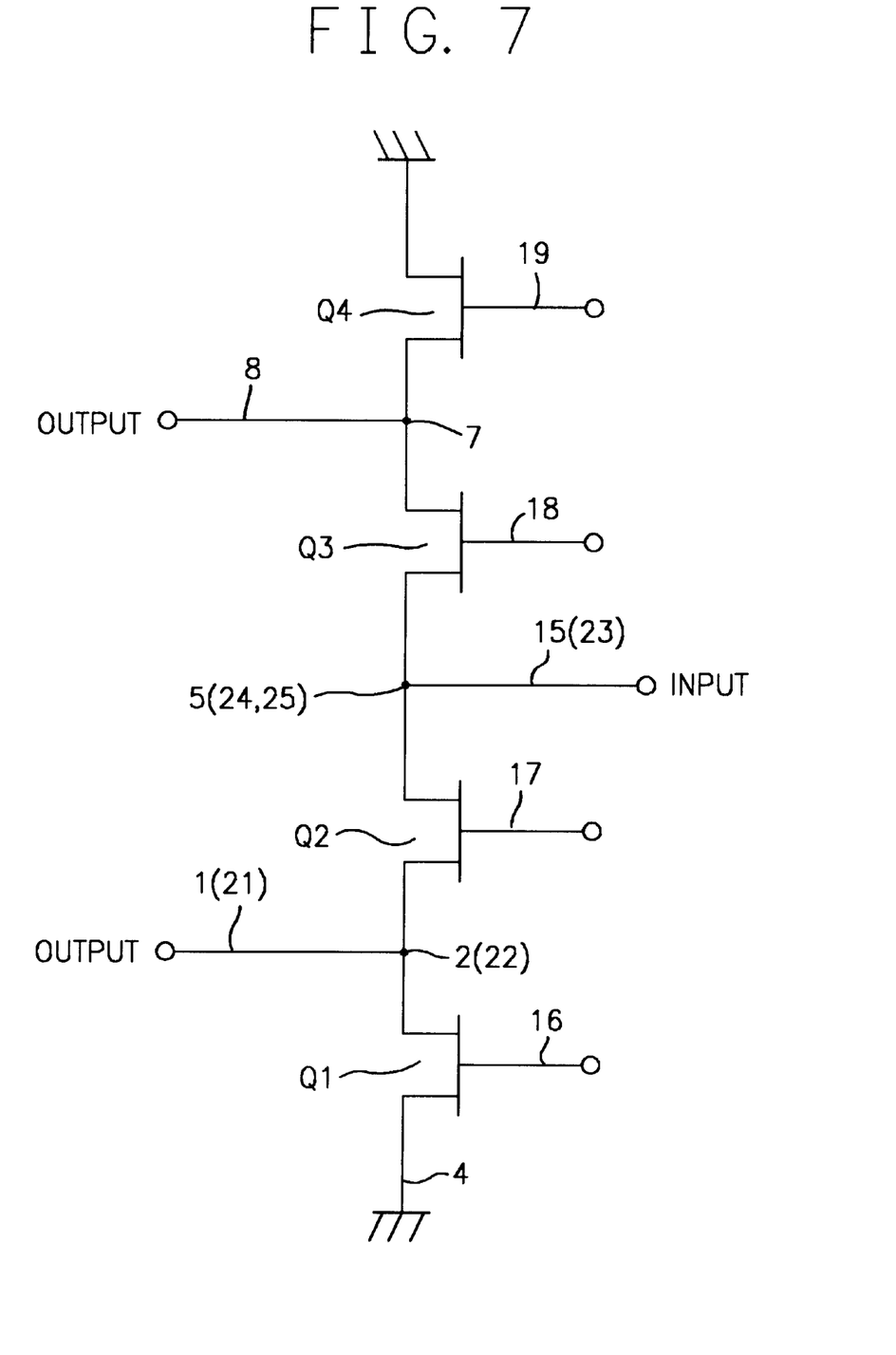
FIG. 7 is a graph showing an equivalent circuit of the embodiments of FIGS. 6 and 8.

FIG. 7 shows an equivalent circuit of the semiconductor device of the fourth embodiment. As shown in FIG. 7, the shared electrode 2 including the drain electrode and the source electrode respectively of the first FET Q1 and the second FET Q2 is connected to the first transmission line 1. In addition, the shared electrode 5 including the drain electrode and the source electrode respectively of the second FET Q2 and the third FET Q3 is linked with the third transmission line 15, and the shared electrode 7 including the drain electrodes of the third and fourth FETs Q3 and Q4 is coupled with the second transmission line 8.

Moreover, the gate electrodes 16 to 19 respectively of the FETs Q1 to Q4 are free from the other gate electrodes, namely, it is possible to independently input signals thereto. Since the gate electrode regions 16 to 19 are fabricated to have the same orientation of the plane of substrate, the area of the switching circuit can be reduced when compared with the circuit configuration including the folded shape of gate electrodes.

Operation of the fourth embodiment the semiconductor device will be described in conjunction with the equivalent circuit thereof shown in FIG. 7. In operation, the gate electrodes 16 and 18 is supplied with first switching signals having an identical potential and the gate electrodes 17 and 19 are supplied with second switching signals having an identical potential, the first switching signal being logically inverted with respect to the second switching signal.

With this provision, when the FETs Q1 and Q3 is on, the FETs Q2 and Q4 is turned off, whereas when the FETs Q1 and Q3 is off, the FETs Q2 and Q4 is turned on. In consequence, when the FETs Q1 and Q3 are on and the FETs Q2 and Q4 are off according to the first and second switching signals, an input signal, for example, a signal of a microwave band inputted via the transmission line 15 is selectively delivered via the source and drain of the FET Q3 to the transmission line 8.

Conversely, when the FETs Q1 and Q3 are set to off and the FETs Q2 and Q4 are turned on in response to the first and second switching signals, an input signal, for example, the signal inputted from the transmission line 15 is transmitted via the drain and source of the FET Q2 to the transmission line 1.

Figure 13:
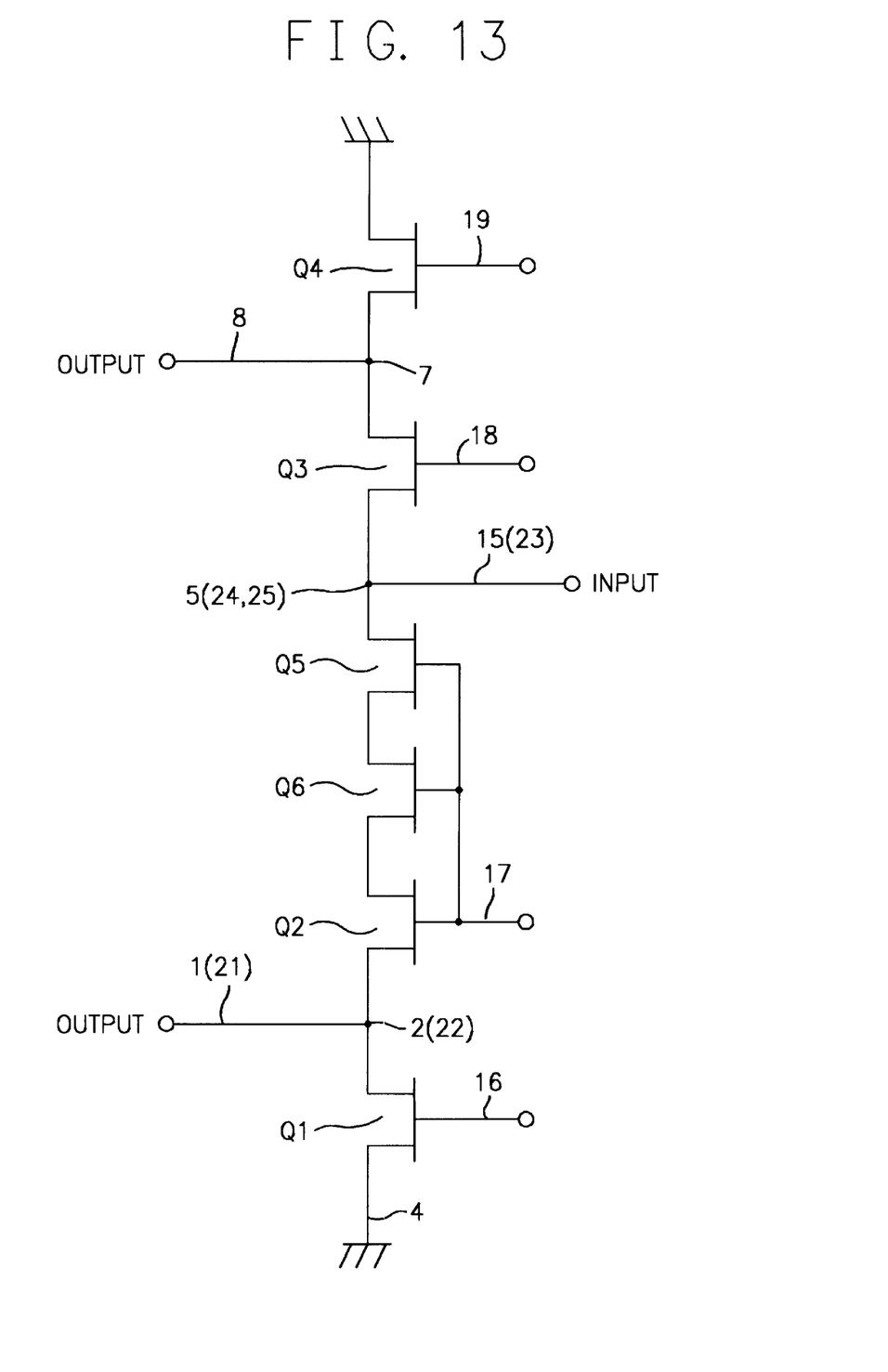
FIG. 13 is an illustration of a circuit representing an embodiment of the present invention.

FIG. 13 illustrates a circuit which differs from that of FIG. 7 by the inclusion of FETs Q5 and Q6 arranged in series with FET Q2, with the gates of Q2, Q5, and Q6 connected to one another. This arrangement is similar to the series connected and gate-interconnected FETs Q2 and Q3 of FIG. 3.

Figure 8:
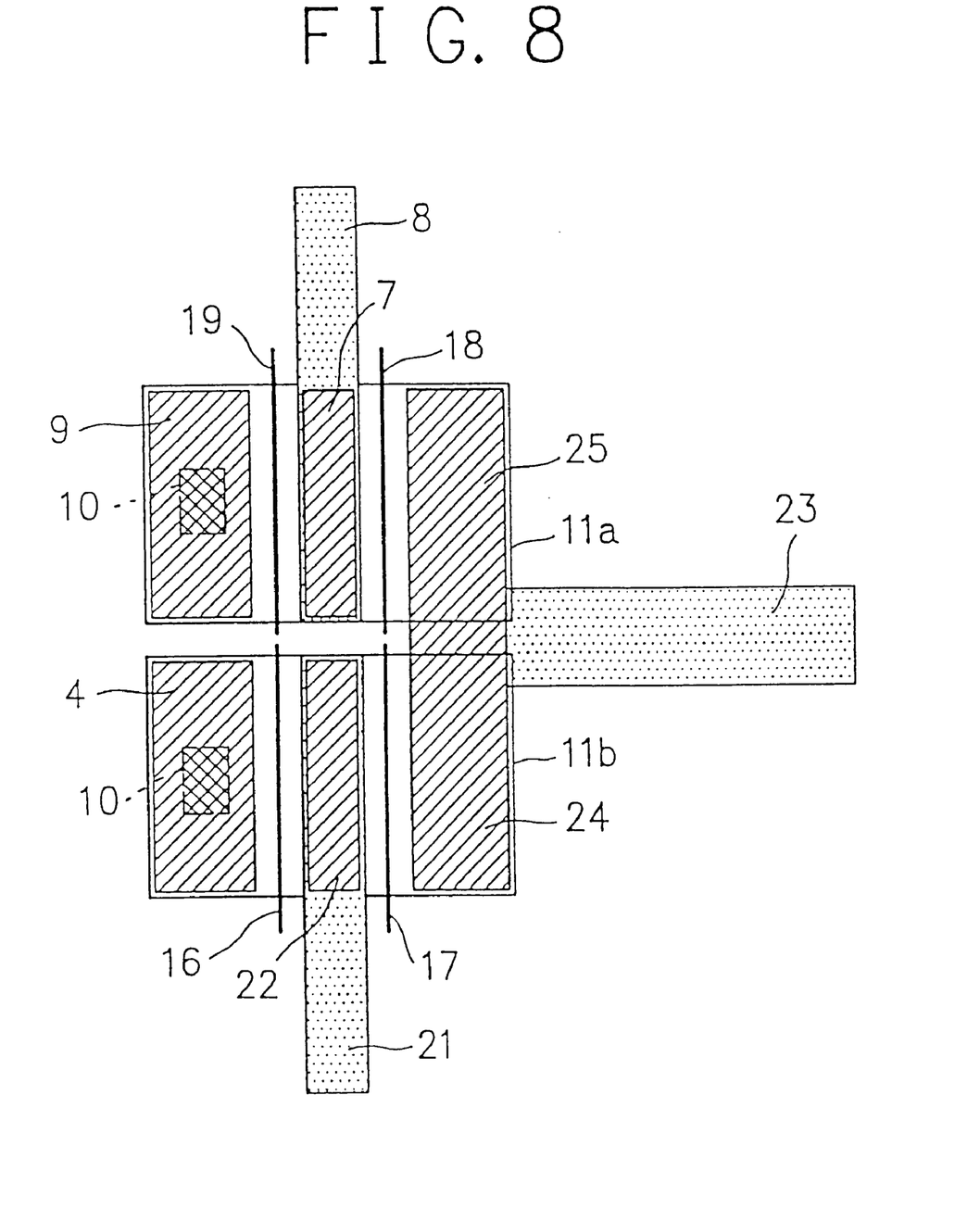
FIG. 8 is a plan view showing the configuration of a fifth embodiment of the semiconductor device in accordance with the present invention.

FIG. 8 is a plan view showing a fifth configuration of the semiconductor in accordance with the present invention. In the diagram, the same constituent elements as those of FIG. 6 are assigned with the same reference numerals. The configuration of FIG. 8 includes a first transmission line 21 connected to a shared electrode 22 including the drain electrodes of the first and second FETs. Included further in the configuration is a second transmission line 8 coupled with the shared electrode 7 including the drain electrodes of the third and fourth FETs. The device moreover includes a third transmission electrode 23 connected to the source electrode 24 of the second FET and to the source electrode 25 of the third FET.

In addition, the source electrodes 4 and 9 respectively of the first and fourth FETs are connected via the via hole 10 to grounding electrodes, respectively. In the embodiment, the source electrode 4 of the first FET is disposed in the vicinity of the source electrode 9 of the fourth FET, the first and second transmission lines 21 and 8 are provided in an identical straight line, and the third transmission line 23 is disposed to have a longitudinal direction perpendicular to that of the first and second transmission lines 21 and 8. Moreover, there are arranged active regions 11a and 11b.

Furthermore, since the gate electrodes 16 to 19 are fabricated to have the same orientation of the plane of substrate, leading to an advantage that the area occupied by the switching circuit is decreased when compared with the case in which the gate electrodes are manufactured in the folded contour.

The equivalent circuit of the fifth embodiment of the semiconductor device is substantially the same as the fourth embodiment shown in FIG. 7. Therefore, the input signal fed from the third transmission line 23 is selectively outputted to the first or second transmission line 21 or 8 through the switching operation.

Subsequently, description will be given specifically of the respective embodiments above. In the first embodiment of FIG. 2, a GaAlAs heterojunction FET is adopted as the semiconductor substrate in which the gate length and width are 0.15 μm and 50 μm, respectively. The switching device has 100 μm×170 μm in size. A switching device including as many FETs as that of FIG. 2, for example, the switching device described in pages 1486 to 1493 of the IEEE Trans. Microwave Theory Tech., vol. MTT-35, December 1987 occupies an area of about 300 μm×600 μm. Consequently, the area occupied by the switching device of the embodiment is advantageously reduced to about one tenth that of the conventional switching device.

Figure 9:
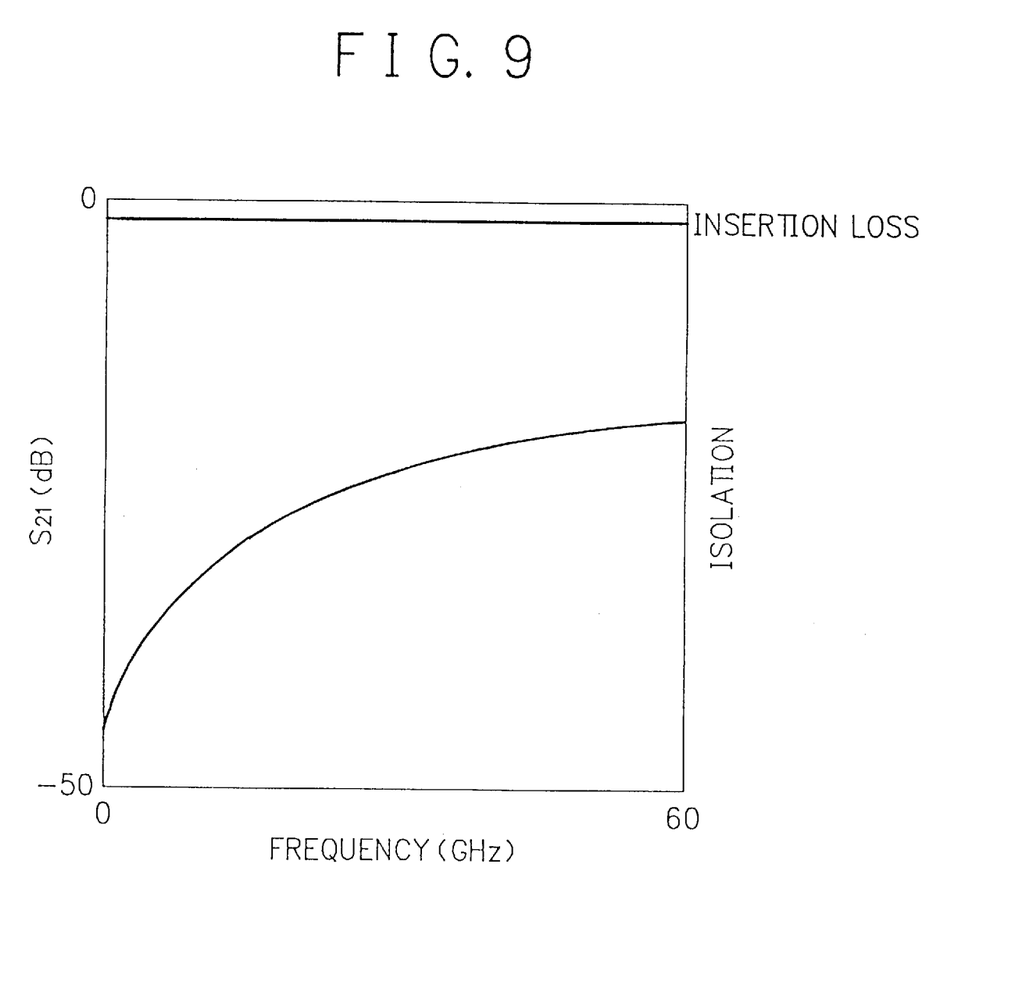
FIG. 9 is a graph showing an example of the transmission characteristic of the embodiment of FIG. 2.

FIG. 9 is a graph showing a transmission characteristic of the semiconductor of FIG. 2 in which the ordinate and abscissa represent loss $S_{21}$ taking place between the transmission lines 1 and 8 and an input signal frequency. As can be seen from the graph, the semiconductor device of FIG. 2 has a satisfactory switching characteristic of a low insertion loss in a wide band and a high isolation. When compared with the switching circuit of the prior art, the size of the switching device can be remarkably minimized without deteriorating the characteristic.

In the second embodiment of the switching device in accordance with the present invention shown in FIG. 4, a GaAlAs heterojunction FET is employed as a semiconductor substrate and the gate length and width are 0.15 μm and 50 μm, respectively. The size of the switching device is 80 μm×170 μm. In comparison with the first embodiment, the area is further reduced to ⅘ that of the device of the first embodiment. Namely, when compared with the conventional example about 300 μm×600 μm, the area of the present embodiment is reduced to about 8% that of the conventional device. According to the second embodiment, the switching device can be much smaller in size.

In the third embodiment of the switching device of FIG. 5, a GaAlAs heterojunction FET is employed as a semiconductor substrate and the gate length and width are 0.15 μm and 50 μm, respectively. The size of the switching device is 100 μm×170 μm. To improve the effect of isolation with substantially the same device area as that of the first embodiment, the gate width of the third FET is reduced to 40 μm. Since the embodiment shown in FIG. 5 has a greater degree of freedom in the combination of FETs, it is possible to precisely design the device for a given target.

Figure 10:
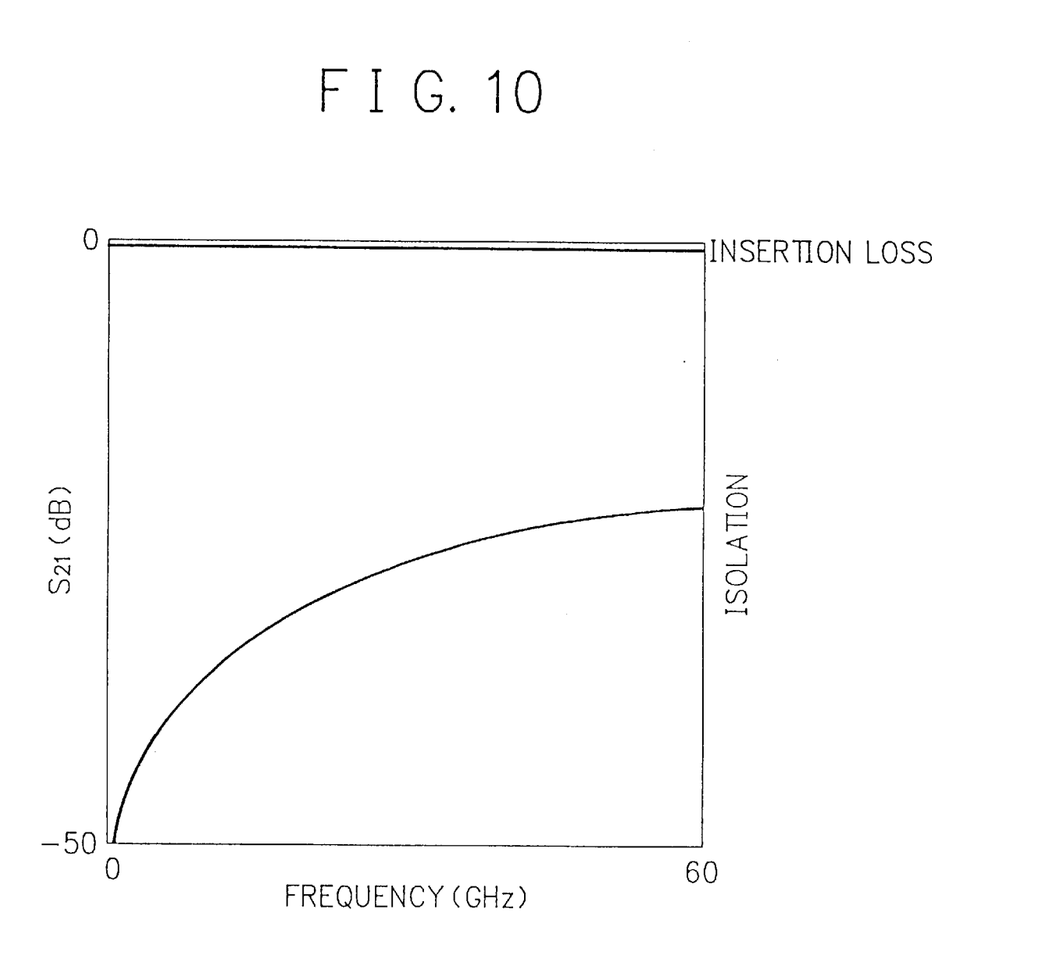
FIG. 10 is a graph showing an example of the transmission characteristic of the embodiment of FIG. 5.

FIG. 10 shows in a graph a transmission characteristic of the semiconductor of FIG. 5. In the graph, the ordinate and abscissa designate loss $S_{21}$ between the transmission lines 1 and 8 and an input signal frequency. As can be seen from the graph, although the semiconductor device of FIG. 2 has a slightly degraded insertion loss when compared with the embodiment of FIG. 2, the isolation efficiency is increased, facilitating a finer design of the device.

The fourth embodiment of the switching device shown in FIG. 6 includes a GaAlAs heterojunction FET as a semiconductor substrate in which the gate length and width of the FET are 0.15 μm and 50 μm, respectively. The size of the switching device is 100 μm×170 μm. Conventionally, the switching device including the same number of FETs as that of the embodiment occupies about 300 μm×600 μm. Namely, the area occupied by the present semiconductor device is about ⅒ that of the prior art.

Figure 11:
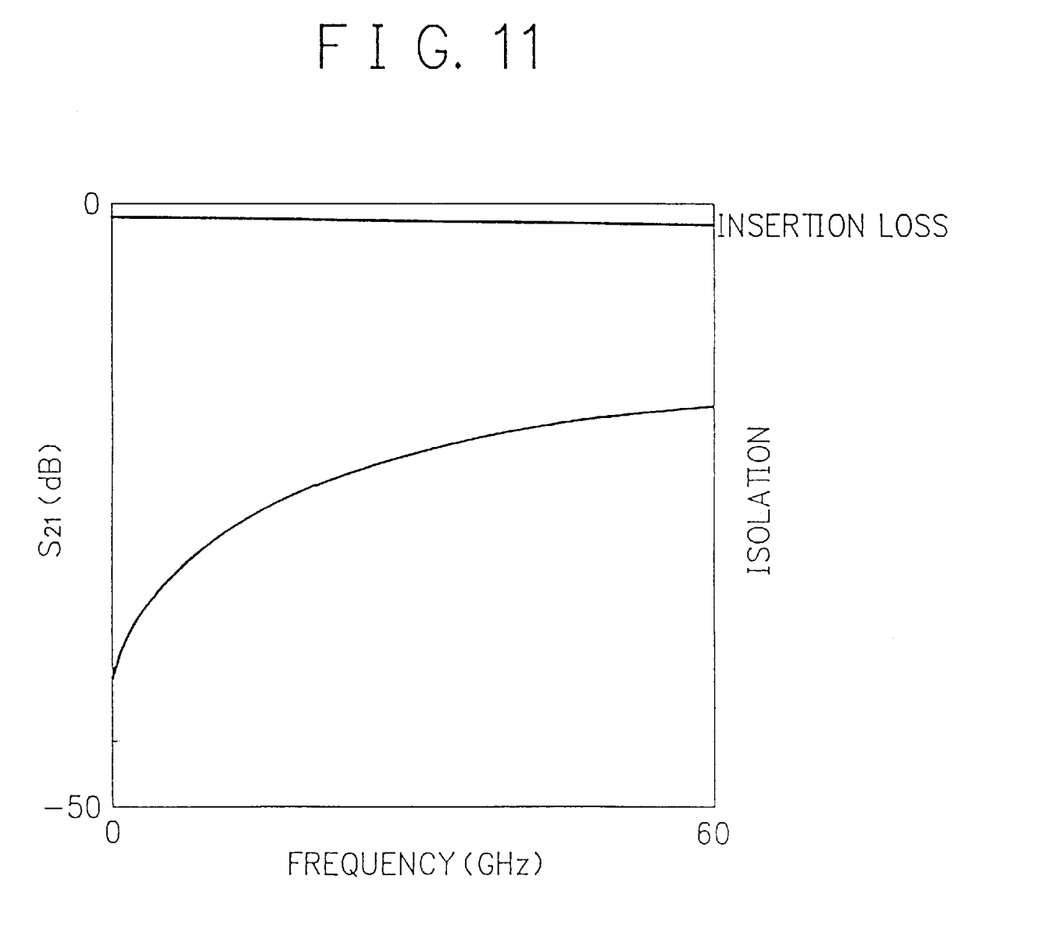
FIG. 11 is a graph showing an example of the transmission characteristic of the embodiment of FIG. 6.

FIG. 11 is a graph showing a transmission characteristic of the embodiment of FIG. 6 in which the ordinate and abscissa represent loss $S_{21}$ taking place between the transmission line 15 and the transmission line 1 or 8 and an input signal frequency, respectively. As shown in the graph, the semiconductor device of FIG. 11 has a satisfactory switching characteristic of a low insertion loss in a wide band and a high isolation. When compared with the switching circuit of the prior art, the size of the switching device can be remarkably minimized.

In the fourth embodiment of the switching device shown in FIG. 8, a GaAlAs heterojunction FET is utilized as a semiconductor substrate in which the gate length and width of the FET are 0.15 μm and 50 μm, respectively. The switching device is 130 μm×170 μm in size. The area occupied by the present semiconductor device is reduced to about 75% that of the fourth embodiment.

Figure 12:
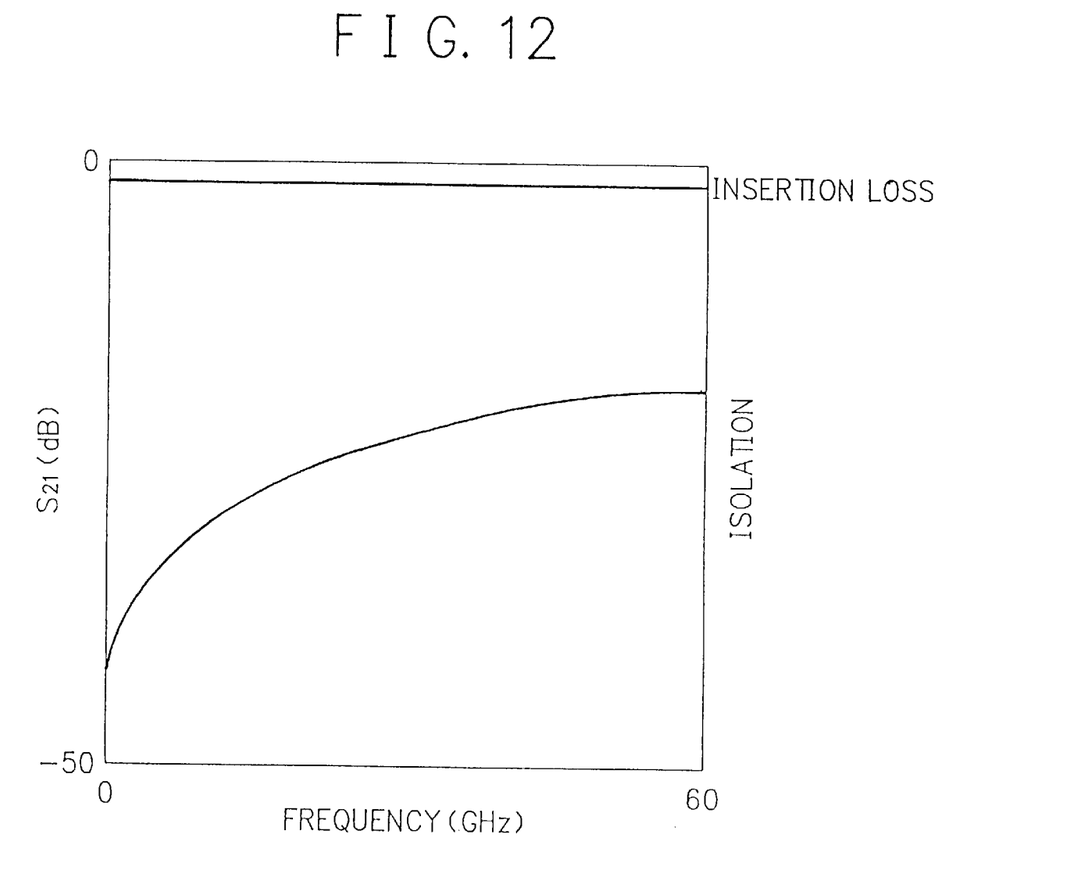
FIG. 12 is a graph showing an example of the transmission characteristic of the embodiment of FIG. 8.

FIG. 12 is a graph showing a transmission characteristic of the embodiment of FIG. 6 in which the ordinate and abscissa represent loss $S_{21}$ taking place between the transmission line 23 and the transmission line 121 or 8 and an input signal frequency, respectively. As can be seen from the graph, the semiconductor device of FIG. 12 has a satisfactory switching characteristic like in the case of FIG. 11. When compared with the switching circuit of the fourth embodiment, the size of the fifth embodiment is much smaller.

Incidentally, in two adjacent FETs including a first FET and a second FET in the embodiments above, all of the source or drain electrodes of the first FET are shared with all of the drain or source electrodes of the second FET. However, the present invention is not restricted by the configuration. Namely, it may also possible that a portion of the source or drain electrodes of the first FET are shared with all or a portion of the drain or source electrodes of the second FET.

Moreover, in the description of the semiconductor device having the equivalent circuit of FIG. 7, the signal supplied to the transmission line 15 or 22 is selectively delivered to either one of the transmission line 1 or 21 and the transmission line 8. However, in the operation of the device, the transmission line 15 or 22 may be used for the input and output operations. For example, when the signal inputted to the transmission line 8 is fed to the transmission line 15 or 22, whereas the signal supplied to the transmission line 15 or 22 is selectively transmitted to the transmission line 1 or 21.

As described above, in accordance with the configuration of the present invention, in two adjacent FETs including a first FET and a second FET connected to each other in series, all or a portion of the source or drain electrodes of the first FET are shared with all or a portion of the drain or source electrodes of the second FET and the respective gate electrodes have the same orientation of the plane of substrate. Consequently, when compared with the conventional semiconductor device including the folded structure of gate electrodes, the area occupied by the electrodes can be reduced and hence the area of the entire device can be decreased to about 1/10 that of the prior art. This makes it possible to implement a semiconductor device achieving a switching function with a minimized size, the device having a low insertion loss in a wide band and a high isolation characteristic.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A semiconductor switching device on a substrate comprising:

a plurality of field-effect transistors (FETs) connected in series to each other between a first transmission line and a second transmission line;

a first FET of said plurality of FETs being adjacent to a second FET of said plurality of FETs, and comprising a source or drain electrode at least a portion of which forms all or part of a drain or source electrode, respectively, of said second FET, a gate electrode of said first FET being connected to a gate electrode of said second FET, said gate electrode of said first and second FETs having an identical orientation to a plane of the substrate; and a third FET adjacent to a fourth FET, said third FET being connected in series with said first transmission line, said fourth FET being connected in series with said second transmission line, a gate electrode of said third FET being connected to a gate electrode of said fourth FET, said gate electrodes of said third and fourth FETs having an identical orientation to the plane of the substrate, said gate electrodes of said third and fourth FETs being free of an ohmic electrode therebetween.

2. A semiconductor switching device on a substrate, comprising:

a plurality of FETs connected in series between a first transmission line and a grounded conductor;

a first FET of said plurality of FETs being adjacent to a second FET of said plurality of FETs, and comprising a source or drain electrode at least a portion of which forms all or part of a drain or source electrode, respectively, of said second FET, a gate electrode of said first FET being connected to a gate electrode of said second FET, said gate electrodes of said first and second FETS having an identical orientation to a plane of the substrate; and a third FET connected in series to a fourth FET, said third FET being connected in series with said first transmission line, said fourth FET being connected in series with a second transmission line, a gate electrode of said third FET being connected to a gate electrode of said fourth FET, said gate electrodes of said third and fourth FETs having an identical orientation to the plane of the substrate, said gate electrodes of said third and fourth FETs being free of an ohmic electrode therebetween.

3. A semiconductor switching device on a substrate, comprising:

at least a first FET being connected in series to a second FET between a first transmission line and a second transmission line, and comprising a source or drain electrode at least a portion of which forms all or part of a drain or source electrode, respectively, of said second FET, a gate electrode of said first FET being connected to a gate electrode of said second FET, the gate electrodes of said first and second FETs having an identical orientation to a plane of the substrate;

at least a third FET connected in series between the first transmission line and a grounded conductor, said third FET sharing a common source or drain electrode with one of said first and second FETs, said third FET including a gate electrode having said identical orientation of said gate electrodes of said first and second FETs; and a fourth FET connected in series between the second transmission line and a grounded conductor, the fourth FET being adjacent to said third FET, a gate electrode of said third FET being connected to a gate electrode of said fourth FET, said gate electrodes of said third and fourth FETs having an identical orientation to a plane of the substrate, said gate electrodes of said third and fourth FETs being free of an ohmic electrode therebetween.

4. A semiconductor switching device on a substrate, comprising:

at least a first FET connected in series between a first transmission line and a third transmission line;

at least a second FET connected in series between a second transmission line and said third transmission line;

at least a third FET connected in series between said first transmission line and a first grounded conductor;

at least a fourth FET connected in series between said second transmission line and a second grounded conductor, and a fifth FET and a sixth FET connected in series with one of the first through fourth FETs, gate electrodes of the fifth and sixth FETs being connected to a gate electrode of said FET with which said fifth and sixth FETs are connected in series said gate electrodes of said fifth and sixth FETs being free of an ohmic electrode therebetween;

wherein in two adjacent said FETS, a portion of a source or drain electrode of one of said two adjacent FETs forms all or part of a drain or source electrode, respectively, of another of said two adjacent FETs, gate electrodes of all of said FETs having an identical orientation to a plane of the substrate, and said gate electrode of said first FET being insulated from said gate electrode of said second FET.

* * * * *